United States Patent
Kusuyama et al.

(10) Patent No.: US 12,255,224 B2
(45) Date of Patent: Mar. 18, 2025

(54) ELECTRONIC COMPONENT MODULE

(71) Applicant: Murata Manufacturing Co., Ltd., Nagaokakyo (JP)

(72) Inventors: Takafumi Kusuyama, Nagaokakyo (JP); Tsuyoshi Takakura, Nagaokakyo (JP); Tadashi Nomura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 849 days.

(21) Appl. No.: 17/465,106

(22) Filed: Sep. 2, 2021

(65) Prior Publication Data

US 2021/0399084 A1    Dec. 23, 2021

Related U.S. Application Data

(63) Continuation of application No. PCT/JP2020/011882, filed on Mar. 18, 2020.

(30) Foreign Application Priority Data

Mar. 22, 2019    (JP) .................................. 2019-054424

(51) Int. Cl.
*H01L 23/64* (2006.01)
*H01F 17/00* (2006.01)
(Continued)

(52) U.S. Cl.
CPC .............. *H01L 28/10* (2013.01); *H01L 23/31* (2013.01); *H01L 23/645* (2013.01)

(58) Field of Classification Search
CPC .................. H01L 23/31; H01L 23/3121; H01L 23/49811; H01L 23/552; H01L 23/645;
(Continued)

(56) References Cited

U.S. PATENT DOCUMENTS 6,091,310 A * 7/2000 Utsumi ................. H01L 23/645
336/200
2015/0162307 A1* 6/2015 Chen .................. H01L 23/49827
438/107
(Continued)

FOREIGN PATENT DOCUMENTS

JP    2009188144 A    8/2009
JP    2012009611 A    1/2012
(Continued)

OTHER PUBLICATIONS

International Search Report issued for PCT/JP2020/011882, date of mailing Jun. 16, 2020.
(Continued)

*Primary Examiner* — Omar F Mojaddedi
(74) *Attorney, Agent, or Firm* — ArentFox Schiff LLP (57)    ABSTRACT

An electronic component module that includes a substrate, an inductor element, a single-sided functional component, a sealing resin, and an electromagnetic shield. The inductor element is mounted on the substrate. The single-sided functional component is mounted on a base ground conductor and a base signal conductor that are disposed on a side of the inductor element opposite to the substrate. The sealing resin has an insulating property and covers the inductor element, the base ground conductor, the base signal conductor, and the single-sided functional component. The electromagnetic shield covers the sealing resin, and a ground surface of the single-sided functional component.

8 Claims, 6 Drawing Sheets

(51) Int. Cl.
*H01L 23/31* (2006.01)
*H01L 25/16* (2023.01)
*H01L 49/02* (2006.01)

(58) Field of Classification Search
CPC ..... H01L 25/0657; H01L 25/16; H01L 28/10; H01F 17/0006; H01F 17/0013; H01F 2017/004; H01F 2017/008
See application file for complete search history.

(56) References Cited

U.S. PATENT DOCUMENTS

| | | |
|---|---|---|
| 2019/0229027 A1 | 7/2019 | Nomiyama et al. |
| 2019/0287938 A1* | 9/2019 | Kim ........................ H01L 25/16 |
| 2019/0348343 A1* | 11/2019 | Kwon .................. H01L 23/552 |
| 2020/0235082 A1* | 7/2020 | Eid ..................... H01L 23/3121 |
| 2020/0365510 A1* | 11/2020 | Lin ........................ H01L 28/10 |
| 2021/0233827 A1* | 7/2021 | Kwon .................. H01L 23/433 |

FOREIGN PATENT DOCUMENTS

| | | |
|---|---|---|
| JP | 2014183180 A | 9/2014 |
| WO | 2014178153 A1 | 11/2014 |
| WO | 2018079278 A1 | 5/2018 |

OTHER PUBLICATIONS

Written Opinion of the International Searching Authority issued for PCT/JP2020/011882, date of mailing Jun. 16, 2020.

* cited by examiner

ELECTRONIC COMPONENT MODULE

CROSS REFERENCE TO RELATED APPLICATIONS

The present application is a continuation of International application No. PCT/JP2020/011882, filed Mar. 18, 2020, which claims priority to Japanese Patent Application No. 2019-054424, filed Mar. 22, 2019, the entire contents of each of which are incorporated herein by reference.

FIELD OF THE INVENTION

The present invention relates to an electronic component including a mounting type inductor element.

BACKGROUND OF THE INVENTION

Patent Literature 1 discloses an electronic component module. The electronic component module disclosed in Patent Literature 1 includes a module substrate, an electronic component, a mold resin, and an electromagnetic wave shield. The electronic component is mounted on a main surface of the module substrate. The mold resin is provided on the main surface of the module substrate so as to cover the electronic component. The electromagnetic wave shield is provided on a surface of the mold resin.

Patent Literature 1: Japanese Unexamined Patent Application Publication No. 2014-183180

SUMMARY OF THE INVENTION

It has been a requirement to reduce the height of electronic component modules. However, in a case in which the height of the electronic component module as disclosed in Patent Literature 1 is attempted to be reduced, a distance between the electronic component and the electromagnetic wave shield becomes small. Then, in a case in which the electronic component includes an inductor element, a small distance between an inductor and the electromagnetic wave shield may cause a problem that the characteristics of the inductor element are degraded.

In addition, it has also been a requirement for the electronic component module to achieve higher density mounting of electronic components.

In view of the foregoing, exemplary embodiments of the present invention provide an electronic component module capable of significantly reducing or preventing the degradation of characteristics of an inductor element and significantly reducing or preventing an increase in size, even when the inductor element is provided in an area surrounded by an electromagnetic shield, while achieving higher density mounting of electronic components.

An electronic component module of the present invention includes a substrate, one or more first electronic components, a second electronic component, a sealing resin, and an electromagnetic shield. The substrate includes a first main surface and a second main surface that face each other, and an external terminal on the second main surface. The one or more electronic components are mounted on the first main surface of the substrate, and include an inductor element. The second electronic component is mounted on a base portion. The sealing resin has an insulating property and covers the one or more first electronic components and at least a mounting surface of the second electronic component. The electromagnetic shield covers an outer surface of the sealing resin and a surface of the second electronic component opposite to the mounting surface of the second electronic component. The inductor element includes a built-in inductor conductor having a helical shape, and an axial direction of a helix of the inductor conductor is perpendicular to the first main surface.

In this configuration, electronic components are mounted in two stages, so that high density mounting equivalent to double-sided mounting is achieved. Further, a distance between the inductor element and the electromagnetic shield becomes greater as the second electronic component is disposed.

According to the present invention, while higher density mounting of electronic components is achieved, the degradation of characteristics of the inductor element is able to be significantly reduced or prevented, and an increase in size is able to be significantly reduced or prevented, even when the inductor element is provided in an area surrounded by an electromagnetic shield.

DETAILED DESCRIPTION OF EXEMPLARY EMBODIMENTS

First Exemplary Embodiment

Figure 1:
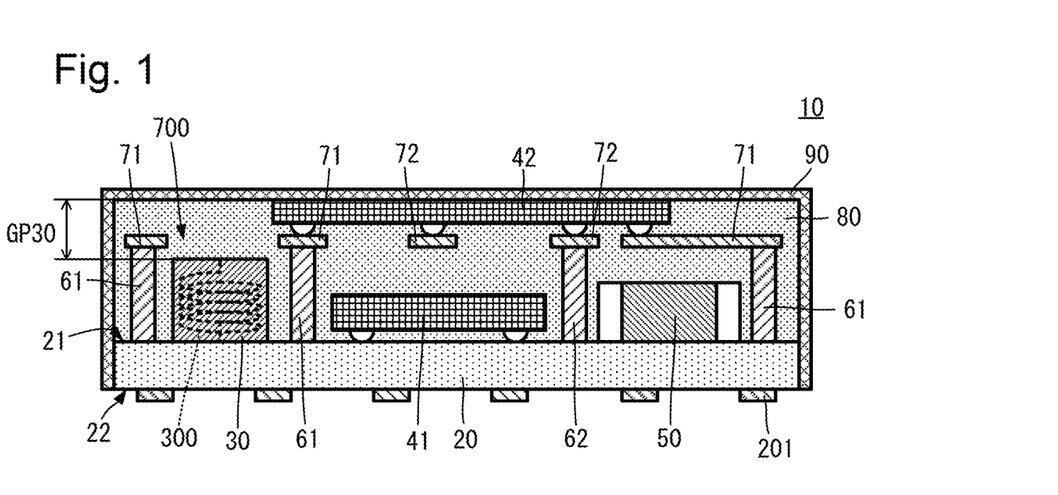
FIG. 1 is a side sectional view showing a configuration of an electronic component module according to a first exemplary embodiment of the present invention.

An electronic component module according to a first exemplary embodiment of the present invention will be described with reference to drawings. FIG. 1 is a side sectional view showing a configuration of the electronic component module according to the first exemplary embodiment of the present invention.

As shown in FIG. 1, the electronic component module 10 includes a substrate 20, an inductor element 30, a single-sided functional component 41, a single-sided functional component 42, a chip-type mounted component 50, a routing conductor 61, a routing conductor 62, a base ground conductor 71, a base signal conductor 72, a sealing resin 80, and an electromagnetic shield 90.

The inductor element 30, the single-sided functional component 41, and the chip-type mounted component 50 correspond to "first electronic components" of the present description, and the single-sided functional component 42 corresponds to a "second electronic component" of the present description. The routing conductor 61, the routing conductor 62, the base ground conductor 71, and the base signal conductor 72 correspond to a "wiring member" of the present description, and the base ground conductor 71 and the base signal conductor 72 correspond to a "base portion" of the present description.

The substrate 20 includes a main surface 21 and a main surface 22 that face each other. The main surface 21 corresponds to a "first main surface" of the present description, and the main surface 22 corresponds to a "second main surface" of the present description. An external terminal 201 is provided on the main surface 22. The external terminal 201 is a conductor pattern to mount the electronic component module 10 on an external circuit board or the like. Although not shown, a land conductor to mount an electronic component is provided on the main surface 21.

The substrate 20 is mainly made of an insulating base material, and a predetermined conductor pattern is provided on the substrate 20. The land conductor on the main surface 21 and the external terminal 201 are connected to each other by a predetermined circuit pattern by the conductor pattern provided on the substrate 20.

The inductor element 30, the single-sided functional component 41, and the chip-type mounted component 50 are mounted on the land conductor on the main surface 21 of the substrate 20. The single-sided functional component 41 has a flat plate shape, and includes a mounting surface, and a top surface opposite to the mounting surface. The single-sided functional component 41 is an IC element using a semiconductor substrate, for example. The single-sided functional component 41 is mounted on the land conductor of the substrate 20 so that the mounting surface thereof may face the main surface 21. It is to be noted that the single-sided functional component 41 is not limited to a component including a semiconductor substrate and may be an elastic wave element including a piezoelectric substrate. The chip-type mounted component 50 includes a resistance element and a capacitor element, for example.

The inductor element 30 is an element in which a helical-shaped inductor conductor 300 is included therein. The inductor element 30 is mounted on the land conductor of the substrate 20 so that the axis of the helical-shaped inductor conductor 300 may be perpendicular to the main surface 21.

The routing conductor 61 and the routing conductor 62 have a pillar shape, for example. A length (height) of the routing conductor 61 and the routing conductor 62 is longer than the height of the inductor element 30, the single-sided functional component 41, and the chip-type mounted component 50, that is, the tallest component among the first electronic components.

One end of the routing conductor 61 and the routing conductor 62 is mounted on the land conductor of the substrate 20.

The base ground conductor 71 and the base signal conductor 72 have a flat film shape. The base ground conductor 71 and the base signal conductor 72 are disposed on a side opposite to the main surface 21 with respect to the mounting position of the first electronic components including the inductor element 30. Specifically, the base ground conductor 71 and the base signal conductor 72 are placed farther from the main surface 21 than the first electronic components including the inductor element 30, the single-sided functional component 41, and the chip-type mounted component 50, in other words, placed higher than these first electronic components. In such a case, the flat film surfaces of the base ground conductor 71 and the base signal conductor 72 are substantially parallel to the main surface 21. The base ground conductor 71 is connected to the other end of the routing conductor 61. The base signal conductor 72 is connected to the other end of the routing conductor 62.

Figure 2:
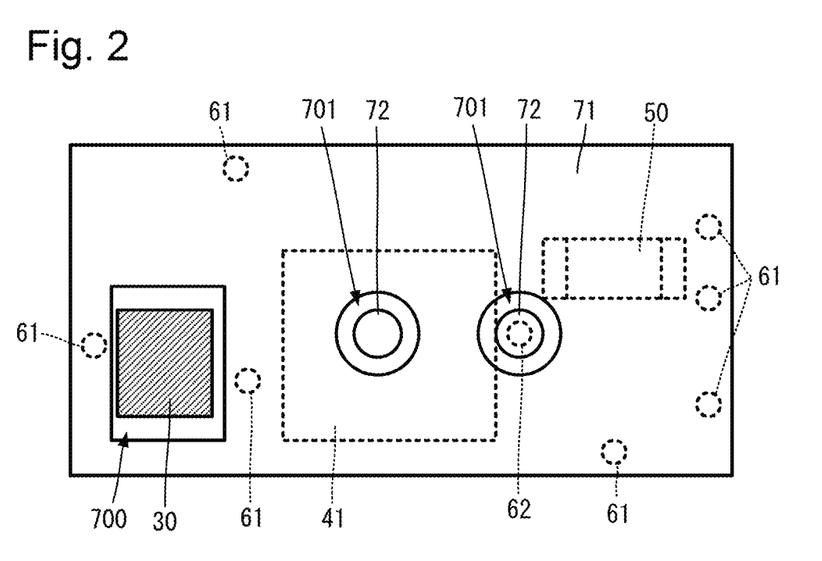
FIG. 2 is a plan view schematically showing a relationship between a base ground conductor and a base signal conductor, a routing conductor and a routing conductor, and mounting positions of first electronic components.

FIG. 2 is a plan view schematically showing a relationship between the base ground conductor and the base signal conductor, the routing conductor and the routing conductor, and mounting positions of the first electronic components.

The base ground conductor 71 and the base signal conductor 72 are separated by a conductor-free portion (an opening portion) 701. The base ground conductor 71 overlaps a plurality of routing conductors 61. Some of the base signal conductors 72 overlap the routing conductor 62.

The base ground conductor 71 includes a conductor-free portion (an opening portion) 700. The conductor-free portion 700 overlaps the inductor element 30, when viewed in a direction perpendicular to the main surface 21 (in a plan view). In other words, the base ground conductor 71 and the inductor element 30, in a plan view, are not overlapped with each other and are disposed at different positions.

The single-sided functional component 42 is mounted on the base ground conductor 71 and the base signal conductor 72. Specifically, the single-sided functional component 42 is disposed farther from the main surface 21 than the first electronic components including the inductor element 30, the single-sided functional component 41, and the chip-type mounted component 50, in other words, disposed higher than these first electronic components. The single-sided functional component 42 has a flat plate shape, and includes a mounting surface, and a top surface opposite to the mounting surface. The single-sided functional component 42 is an IC element using a semiconductor substrate, for example. The single-sided functional component 42 is mounted so that the mounting surface may be on the side of the base ground conductor 71 and the base signal conductor 72. It is to be noted that the single-sided functional component 42 is not limited to a component including a semiconductor substrate and may be an elastic wave element including a piezoelectric substrate.

The single-sided functional component 42 is preferably thinner than the single-sided functional component 41. In addition, the single-sided functional component 42 is preferably thin enough that the functional portion provided near the mounting surface of the single-sided functional component 42 is not damaged and that the electrical characteristics are not degraded. The height of the single-sided functional component 42 is reduced, which causes the height of the electronic component module 10 to be further reduced.

The sealing resin 80 covers the side of the main surface 21 of the substrate 20. In such a case, the sealing resin 80 covers the inductor element 30, the single-sided functional component 41, the chip-type mounted component 50, the routing conductor 61, the routing conductor 62, the base ground conductor 71, and the base signal conductor 72. Furthermore, the sealing resin 80 covers each surface except the top surface opposite to the mounting surface in the single-sided functional component 42.

The electromagnetic shield 90 covers the outer surface of the sealing resin 80, and the top surface of the single-sided functional component 42.

In this configuration, the electronic component module 10 includes two stages of electronic components configuring the module. Accordingly, the electronic component module 10 achieves high-density mounting. In such a case, the mounting density can be substantially equivalent to the mounting density when electronic components are mounted on both sides of the substrate 20.

In addition, in this configuration, at least the functional portion and the conductor pattern among all the electronic components configuring the electronic component module 10 are covered with a resin. As a result, the reliability of the electronic component module 10 is improved.

In addition, in this configuration, at least the functional portion among all the electronic components configuring the electronic component module 10 is covered by the electromagnetic shield 90. As a result, electromagnetic interference with the outside is significantly reduced or prevented.

In addition, in this configuration, a region corresponding to a thickness of the single-sided functional component 42, the base ground conductor 71, and the base signal conductor 72 is present between the inductor element 30 and the electromagnetic shield 90. Therefore, a distance GP30 between the inductor element 30 and the electromagnetic shield 90 is able to be increased. Accordingly, it is possible to significantly reduce or prevent the magnetic field generated by the inductor element 30 from interfering with the electromagnetic shield 90 to generate an eddy current in the electromagnetic shield 90. As a result, the degradation of the Q characteristics of the inductor element 30 is able to be significantly reduced or prevented.

Specifically, in the conventional structure, in a case in which the height of the electronic component module is attempted to be reduced, a distance between mounted electronic components and the electromagnetic shield becomes small. However, according to the configuration of the present disclosure, the electronic components are able to be arranged in a two-stage structure and further the electronic components on the upper stage are able to be configured to be thinner, so that the degradation of module characteristics is able to be significantly reduced or prevented while the overall height is reduced.

Then, as described above, in a case in which the axial direction of the helical-shaped inductor conductor is perpendicular to the main surface 21, in other words, in a case in which the axial direction of the helical-shaped inductor conductor is perpendicular to the base ground conductor 71, this effect becomes particularly effective.

Furthermore, in this configuration, in a plan view, the inductor element 30 and the base ground conductor 71 are not overlapped with each other. As a result, the magnetic field generated by the inductor element 30 is also able to be significantly reduced or prevented from interfering with the base ground conductor 71.

In addition, in this configuration, in a plan view, the inductor element 30 and the single-sided functional component 42 are not overlapped with each other. As a result, the magnetic field generated by the inductor element 30 is also able to be significantly reduced or prevented from interfering with a conductor portion of the single-sided functional component 42.

In addition, in this configuration, the grounds of the single-sided functional component 42 are collected by the base ground conductor 71 and are connected to the substrate 20. As a result, the grounds of the single-sided functional component 42 are stabilized. In addition, a position of the routing conductor 61 is appropriately set, so that the flexibility of a wiring pattern to connect the grounds of the single-sided functional component 42 to the substrate 20 is able to be increased.

The electronic component module 10 of such a configuration is able to be manufactured as follows, for example. FIG. 3A, FIG. 3B, FIG. 3C, FIG. 3D, FIG. 4A, FIG. 4B, FIG. 4C, FIG. 4D, FIG. 5A, and FIG. 5B are side sectional views of the electronic component module according to the first exemplary embodiment of the present invention, in respective manufacturing steps.

Figure 3A:
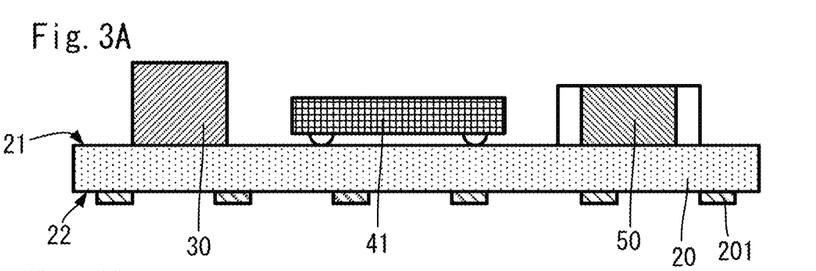
FIG. 3A, FIG. 3B, FIG. 3C, and FIG. 3D are side sectional views of the electronic component module according to the first exemplary embodiment of the present invention, in respective manufacturing steps.
Figure 3B:
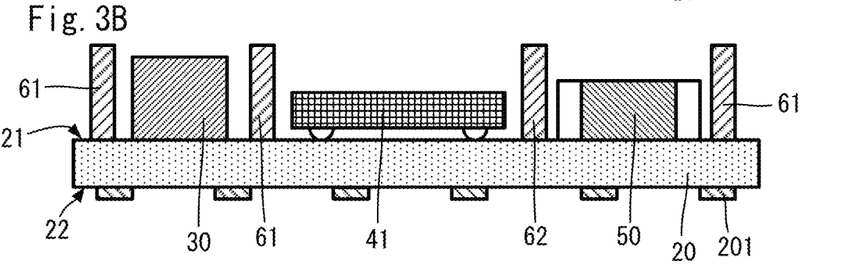

First, as shown in FIG. 3A, an inductor element 30, a single-sided functional component 41, and a chip-type mounted component 50 are mounted on a main surface 21 of a substrate 20. Subsequently, as shown in FIG. 3B, a routing conductor 61 and a routing conductor 62 are mounted on the main surface 21 of the substrate 20. In such a case, the routing conductor 61 and the routing conductor 62 are pillar-shaped conductors.

Figure 3C:
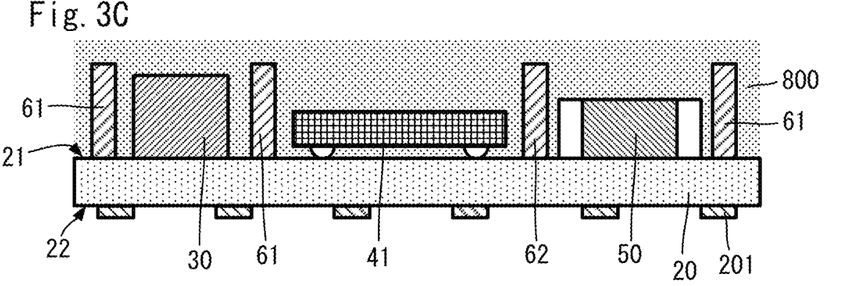
Figure 3D:
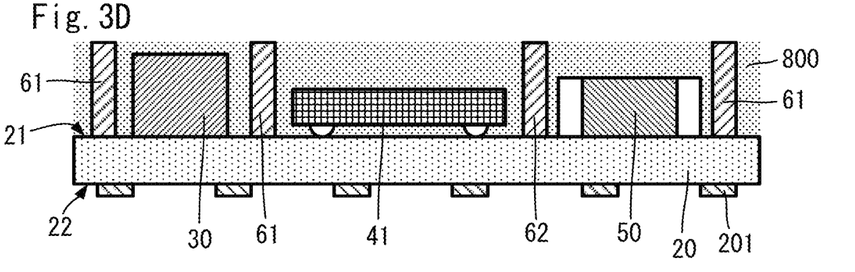

As shown in FIG. 3C, the main surface 21 of the substrate 20 is covered with a sealing resin 800. The sealing resin 800 is provided so as to cover all of the inductor element 30, the single-sided functional component 41, the chip-type mounted components 50, the routing conductors 61, and the routing conductors 62. Subsequently, as shown in FIG. 3D, the sealing resin 800 is shaved from a side opposite to the main surface 21, and the end surface of the routing conductor 61 and the routing conductor 62 are exposed.

Figure 4A:
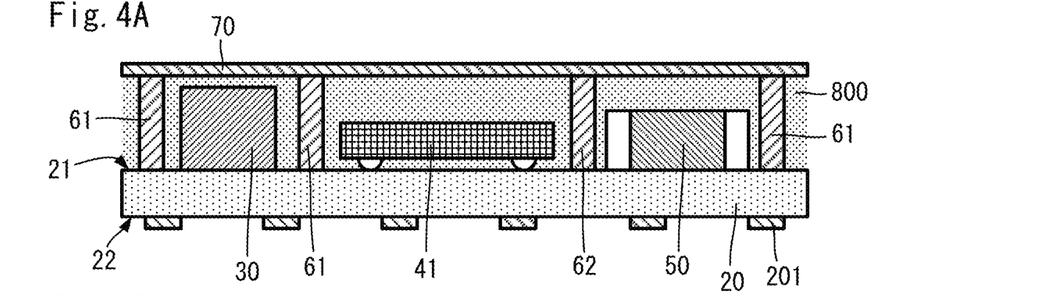
FIG. 4A, FIG. 4B, FIG. 4C, and FIG. 4D are side sectional views of the electronic component module according to the first exemplary embodiment of the present invention, in respective manufacturing steps.
Figure 4B:
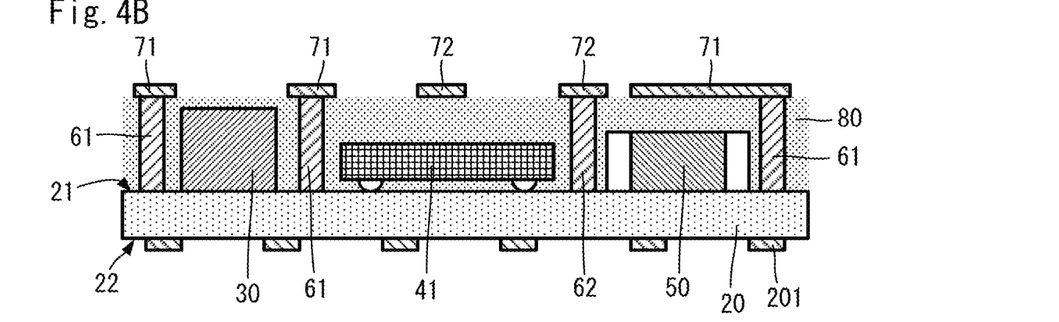

Subsequently, as shown in FIG. 4A, a base conductor 70 is provided on a surface to which the routing conductor 61 and the routing conductor 62 in the sealing resin 800 are exposed. As shown in FIG. 4B, the base conductor 70 is patterned to provide the base ground conductor 71 and the base signal conductor 72.

Figure 4C:
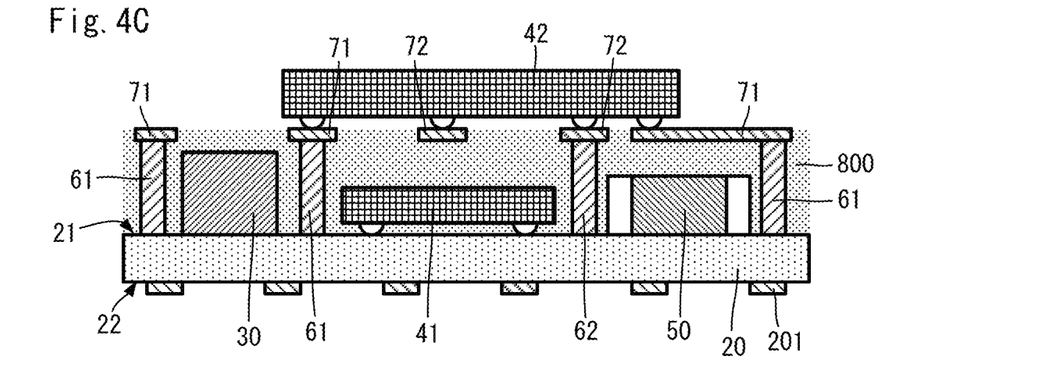

Subsequently, as shown in FIG. 4C, a single-sided functional component 42 is mounted on the base ground conductor 71 and the base signal conductor 72.

Figure 4D:
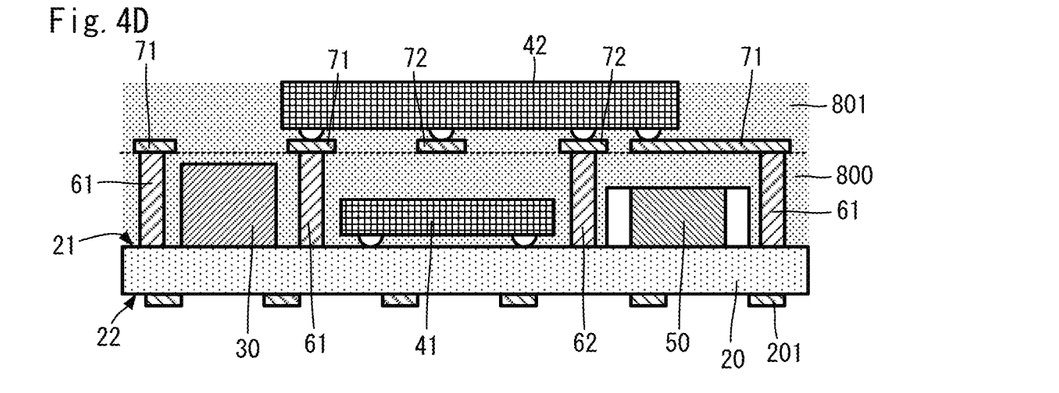
Figure 5A:
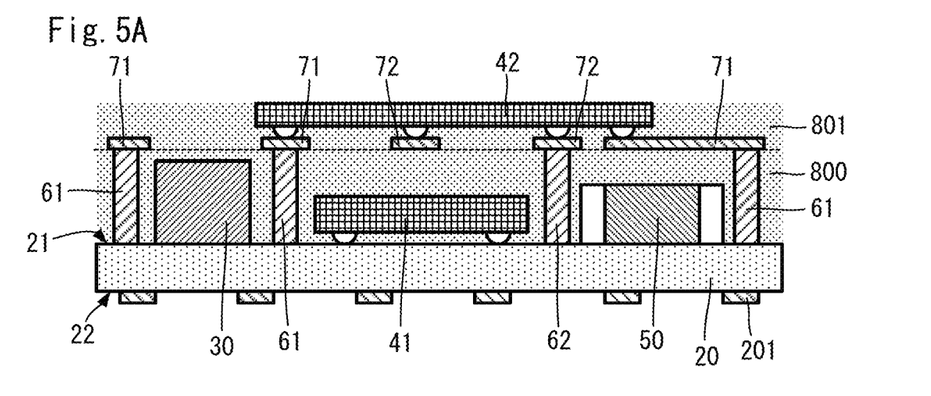
FIG. 5A and FIG. 5B are side sectional views of the electronic component module according to the first exemplary embodiment of the present invention, in respective manufacturing steps.

Subsequently, as shown in FIG. 4D, a sealing resin 801 is provided so as to cover the single-sided functional component 42. As shown in FIG. 5A, the single-sided functional component 42 is shaved from the ground surface. At this time, the sealing resin 801 is also shaved simultaneously.

Figure 5B:
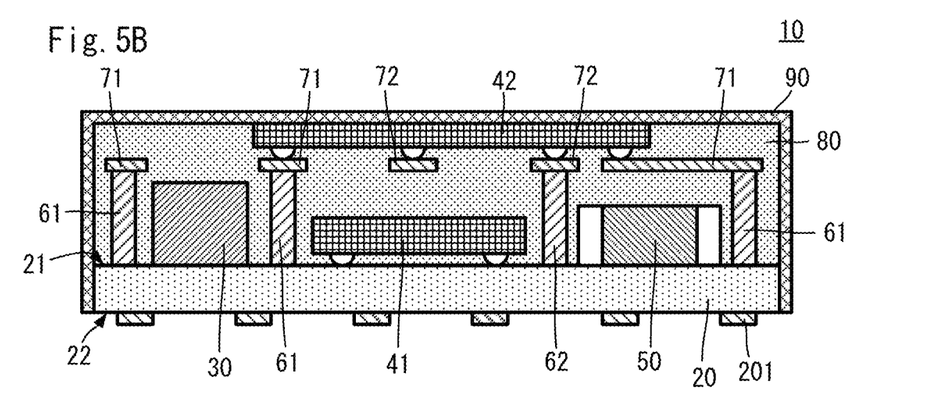

Subsequently, as shown in FIG. 5B, an electromagnetic shield 90 is provided so as to cover the outer surface of a sealing resin 80 defined by the sealing resin 800 and the sealing resin 801, the single-sided functional component 42, and a side surface of the substrate 20.

Second Exemplary Embodiment

Figure 6:
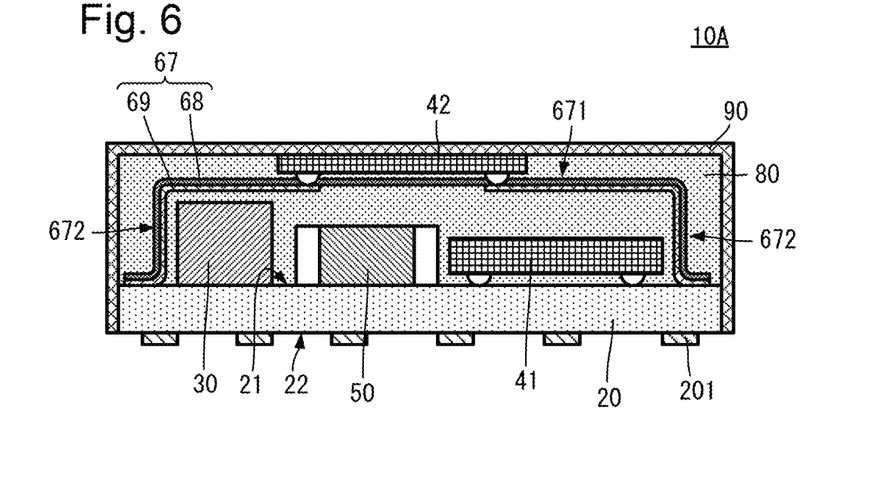
FIG. 6 is a side sectional view showing a configuration of an electronic component module according to a second exemplary embodiment of the present invention.

An electronic component module according to a second exemplary embodiment of the present invention will be described with reference to FIG. 6. FIG. 6 is a side sectional view showing a configuration of the electronic component module according to the second exemplary embodiment of the present invention.

As shown in FIG. 6, the electronic component modules 10A according to the second exemplary embodiment is different in the shape of a wiring member from the electronic component module 10 according to the first exemplary embodiment. Other configurations of the electronic component module 10A are the same as or similar to the configurations of the electronic component module 10, and a description of the same or similar configuration will be omitted.

The electronic component module 10A includes a wiring member 67. The wiring member 67 includes a resin film 68 and a conductor pattern 69.

The wiring member 67 includes a first portion 671 and a second portion 672. The first portion 671 has a shape extending in a plane substantially parallel to the main surface 21 of the substrate 20. The second portion 672 has a shape mainly extending in a direction perpendicular to the main surface 21. The second portion 672 is connected to a land conductor (not shown) on the main surface 21 of the substrate 20 while being connected to the first portion 671.

It is to be noted that, while FIG. 6 shows that the wiring member 67 surrounds the inductor element 30, the single-sided functional component 41, and the chip-type mounted component 50, the shape of the wiring member 67 is not limited to this example. For example, the wiring member 67 does not need to surround the inductor element 30.

The resin film 68 is made of a thermoplastic resin such as a liquid crystal polymer, for example, and is deformable by heating. By use of the deformable characteristics, the shape of the above-described wiring member 67 is able to be obtained.

The conductor pattern 69 is provided on the resin film 68. The conductor pattern 69 of the first portion 671 provides the base ground conductor 71 and the base signal conductor 72 according to the first exemplary embodiment. The conductor pattern 69 of the second portion 672 provides the routing conductor 61 and the routing conductor 62.

It is to be noted that, in a plan view, in a case in which the first portion 671 overlaps the inductor element 30, the conductor pattern 69 is preferably not provided of at a part of the first portion 671 that overlaps the inductor element 30.

Even with such a configuration, the electronic component module 10A is able to obtain the same effects and advantages as the effects and advantages of the electronic component module 10. In addition, with this configuration, the wiring member is able to be mounted on the substrate 20 as one type of a mounted component, which simplifies a manufacturing process.

It is to be noted that, while the second exemplary embodiment shows a mode in which a thermoplastic resin is used, the electronic component module 10A is also able to be made of other resins. Furthermore, the electronic component module 10A may be able to be made of a rigid flexible board in which the first portion 671 is made of a rigid substrate and the second portion 672 is made of a flexible substrate.

REFERENCE SIGNS LIST 10, 10A: electronic component module
20: substrate
21, 22: main surface
30: inductor element
41, 42: single-sided functional component
50: chip-type mounted component
61, 62: routing conductor
67: wiring member
68: resin film
69: conductor pattern
70: base conductor
71: base ground conductor
72: base signal conductor
80: sealing resin
90: electromagnetic shield
201: external terminal
300: inductor conductor
671: first portion
672: second portion
700: conductor-free portion
800, 801: sealing resin

The invention claimed is:

1. An electronic component module comprising:
a substrate including a first main surface and a second main surface that face each other;
an external terminal on the second main surface;
one or more first electronic components mounted on the first main surface of the substrate, the one or more first electronic components including an inductor element;
a second electronic component disposed on a side of the inductor element opposite to the first main surface;
a sealing resin having an insulating property and covering the one or more first electronic components and at least a mounting surface of the second electronic component; and
an electromagnetic shield covering the sealing resin and a surface of the second electronic component opposite to the mounting surface of the second electronic component, wherein
a distance between the inductor element and the electromagnetic shield is greater than or equal to a thickness of the second electronic component.

2. The electronic component module according to claim 1, wherein:
the inductor element includes an inductor conductor having a helical shape; and
an axial direction of a helix of the inductor conductor is perpendicular to the first main surface.

3. The electronic component module according to claim 1, wherein the inductor element and the second electronic component are disposed at different positions when viewed in a direction perpendicular to the first main surface of the substrate.

4. The electronic component module according to claim 1, further comprising a wiring member including a base portion having a conductive property, wherein:
the second electronic component is mounted on the base portion, and
when viewed in a direction perpendicular to the first main surface, a portion of the base portion configuring a ground includes an opening in an area in which the inductor element is disposed.

5. The electronic component module according to claim 1, wherein:
the one or more first electronic components include a first single-sided functional component;
the second electronic component is a second single-sided functional component having a flat plate shape; and
the second single-sided functional component is thinner than the first single-sided functional component.

6. The electronic component module according to claim 4, wherein the wiring member includes:
a routing portion having a conductive property and connected to the base portion and an electrode pattern of the first main surface of the substrate; and
a resin film holding the base portion and the routing portion.

7. The electronic component module according to claim 1, further comprising a wiring member that includes:
a plurality of routing conductors each having a height longer than that of the inductor element; and
a base portion on which the second electronic component is mounted.

8. The electronic component module according to claim 1, wherein, in a plan view of the electronic component, the inductor element and the second electronic component do not overlap with each other.

* * * * *